(12) United States Patent
Lee et al.

(10) Patent No.: US 11,646,736 B2
(45) Date of Patent: May 9, 2023

(54) LEVEL SHIFTER AND LEVEL SHIFTING METHOD AND SEMICONDUCTOR DEVICE INCLUDING THE SAME

(71) Applicant: Samsung Electronics Co., Ltd., Suwon-si (KR)

(72) Inventors: Nam Hee Lee, Seoul (KR); Ho Joon Kim, Suwon-si (KR); Jung-Ho Song, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 118 days.

(21) Appl. No.: 17/371,544

(22) Filed: Jul. 9, 2021

(65) Prior Publication Data

US 2022/0182056 A1 Jun. 9, 2022

(30) Foreign Application Priority Data

Dec. 7, 2020 (KR) .................. 10-2020-0169531

(51) Int. Cl.
| | |
|---|---|
| *G11C 16/08* | (2006.01) |
| *H03K 19/0175* | (2006.01) |
| *G11C 16/04* | (2006.01) |
| *G11C 16/30* | (2006.01) |
| *G09G 3/20* | (2006.01) |

(52) U.S. Cl.
CPC . *H03K 19/017509* (2013.01); *G11C 16/0483* (2013.01); *G11C 16/08* (2013.01); *G11C 16/30* (2013.01); *G09G 3/20* (2013.01); *G09G 2310/0289* (2013.01)

(58) Field of Classification Search
CPC combination set(s) only.
See application file for complete search history.

(56) References Cited

U.S. PATENT DOCUMENTS

| | | |
|---|---|---|
| 7,746,147 B2 | 6/2010 | Kiritani et al. |
| 8,836,410 B2 | 9/2014 | Jeong |
| 9,236,859 B1 | 1/2016 | Hong |
| 9,461,648 B1 | 10/2016 | Lee et al. |
| 9,690,317 B2 | 6/2017 | Im et al. |
| 2020/0118629 A1* | 4/2020 | Kim ................. G11C 16/32 |

FOREIGN PATENT DOCUMENTS

| | | |
|---|---|---|
| KR | 20070069587 A | 7/2007 |
| KR | 101739053 B1 | 5/2017 |

* cited by examiner

*Primary Examiner* — Jason Lappas
(74) *Attorney, Agent, or Firm* — Muir Patent Law, PLLC (57) ABSTRACT

A semiconductor device includes a memory cell array including a plurality of memory blocks, a control logic, a level shifter configured to generate a first internal voltage and a second internal voltage lower than the first internal voltage using a received external voltage on the basis of a control signal from the control logic, and a row decoder configured to provide the first and second internal voltages generated by the level shifter to the memory cell array. The level shifter generates the first internal voltage using the external voltage, generates the second internal voltage using the generated first internal voltage in a power-up mode of the semiconductor device, and generates the second internal voltage using the external voltage in a standby mode of the semiconductor device.

20 Claims, 12 Drawing Sheets

LEVEL SHIFTER AND LEVEL SHIFTING METHOD AND SEMICONDUCTOR DEVICE INCLUDING THE SAME

This U.S. non-provisional patent application claims priority under 35 U.S.C. § 119 to Korean Patent Application No. 10-2020-0169531, filed on Dec. 7, 2020, in the Korean Intellectual Property Office, the disclosure of which is incorporated herein by reference in its entirety.

BACKGROUND

1. Field of the Disclosure

The present disclosure relates to a level shifter and a level shifting method and a semiconductor device including the same.

2. Description of the Related Art

In general, in the design of a semiconductor integrated circuit, a voltage level shifter may be used for an interface between circuits requiring different voltages in some cases. For example, integrated circuits such as a semiconductor device may operate in a predetermined voltage range but signal voltages exceeding the predetermined voltage range may be necessary to interface with external circuits or provide signals to other circuits. A level shifter used in such a case is a circuit provided between two systems with different signal voltages to change a signal voltage when the two systems are connected to each other. The level shifter is especially used when a signal voltage is changed from a small voltage range to a large voltage range.

In particular, a level shifter is necessary to convert a low-voltage signal into a high-voltage signal to drive a boost converter having a high output voltage, a step-down converter having a high input voltage, or a push pull circuit.

SUMMARY

The present disclosure provides a level shifter for preventing leakage current.

The present disclosure also provides a level shifting method for preventing leakage current.

The present disclosure also provides a semiconductor device including the level shifter for preventing leakage current.

It should be noted that objects of the present disclosure are not limited thereto and other objects of the present disclosure will be apparent to those skilled in the art from the following descriptions.

It should be noted that objects of the present disclosure are not limited to the above-described objects, and other objects of the present disclosure will be apparent to those skilled in the art from the following descriptions.

According to an aspect of the present disclosure, there is provided a semiconductor device comprising, a memory cell array including a plurality of memory blocks, a control logic, a level shifter configured to generate a first internal voltage and a second internal voltage lower than the first internal voltage using a received external voltage on the basis of a control signal from the control logic, and a row decoder configured to provide the first and second internal voltages generated by the level shifter to the memory cell array, wherein the level shifter generates the first internal voltage using the external voltage, generates the second internal voltage using the generated first internal voltage in a power-up mode of the semiconductor device, and generates the second internal voltage using the external voltage in a standby mode of the semiconductor device.

According to an aspect of the present disclosure, there is provided a level shifter of a semiconductor device, comprising, a control logic and a level shifting circuit configured to generate a first internal voltage using a received external voltage on the basis of a control signal from the control logic, wherein the level shifting circuit generates a second internal voltage, which is higher than the first internal voltage, using the external voltage, generates the first internal voltage using the second internal voltage in a first mode of the semiconductor device, and generates the first internal voltage using the external voltage in a second mode of the semiconductor device different from the first mode.

According to an aspect of the present disclosure, there is provided a level shifting method for a semiconductor device, comprising, receiving an external voltage, determining whether the semiconductor device is in a first mode or a second mode, in the first mode, generating a first internal voltage using the received external voltage, and generating a second internal voltage lower than the first internal voltage using the first internal voltage, and in the second mode, generating the second internal voltage using the received external voltage.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EMBODIMENTS

Hereinafter, example embodiments of the present disclosure will be described with reference to the accompanying drawings.

Figure 1:
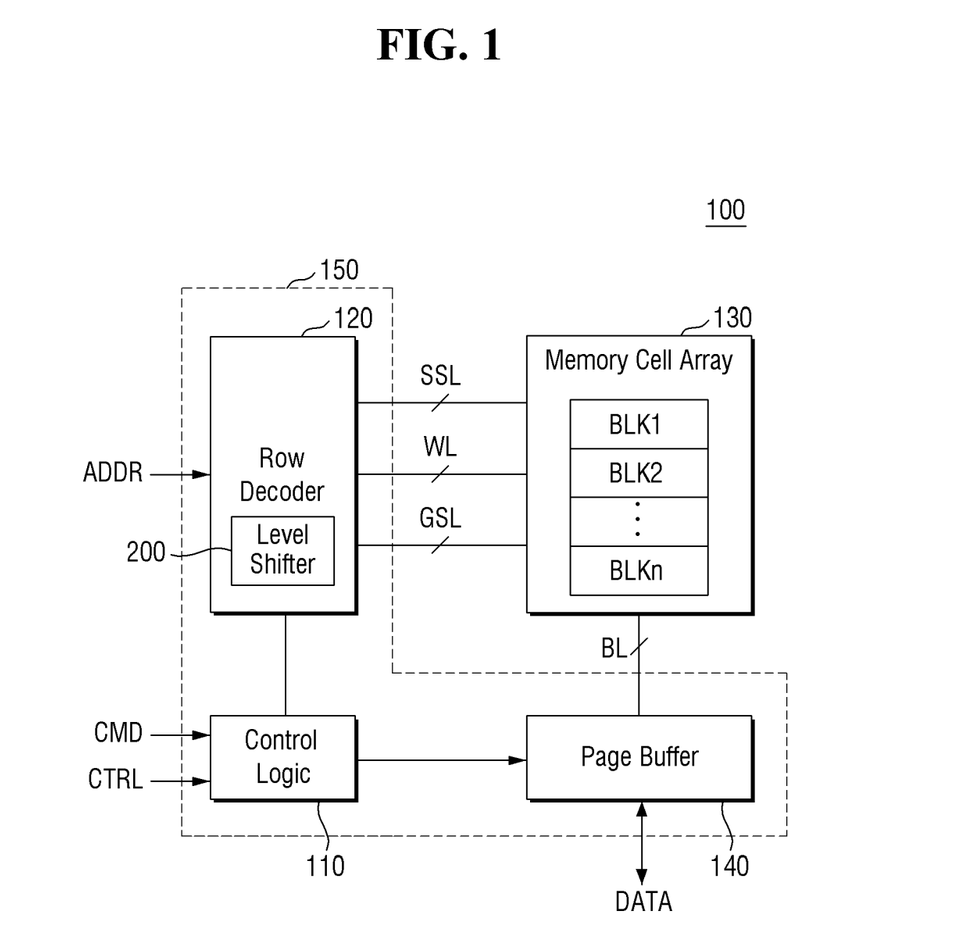
FIG. 1 is a block diagram of a semiconductor device including a level shifter according to some embodiments.

FIG. 1 is a block diagram of a semiconductor device including a level shifter according to some embodiments.

Referring to FIG. 1, a semiconductor device 100 may include a memory cell array 130 and a peripheral circuit 150.

The semiconductor device 100 may include, for example, a NAND flash memory, a vertical NAND (VNAND) flash memory, a NOR flash memory, a resistive random access memory (RRAM), a phase-change RAM (PRAM), a magneto resistive RAM (MRAM), a ferroelectric RAM (FRAM), a spin-transfer torque RAM (STT-RAM), or the like, but embodiments are not limited thereto.

The present disclosure will be described below with respect to a VNAND as an example of the semiconductor device 100, but embodiments according to the present disclosure are not limited thereto. For example, embodiments according to the present disclosure are applicable to nonvolatile memories as described above.

The memory cell array 130 may include a plurality of memory cell blocks BLK1 to BLKn. Each of the memory cell blocks BLK1 to BLKn may include a plurality of memory cells. The memory cell blocks BLK1 to BLKn may be connected to the peripheral circuit 150 through bit lines BL, word lines WL, at least one string select line SSL, and at least one ground select line GSL.

Specifically, the memory cell blocks BLK1 to BLKn may be connected to a row decoder 120 through the word lines WL, at least one string select line SSL, and at least one ground select line GSL. In addition, the memory cell blocks BLK1 to BLKn may be connected to a page buffer 140 through the bit lines BL.

The peripheral circuit 150 may include a control logic 110, the row decoder 120, and the page buffer 140.

The peripheral circuit 150 may receive an address ADDR, a command CMD, and a control signal CTRL from an external device (e.g., a memory controller or a host device) of the semiconductor device 100 and transmit and receive data DATA to and from the external device (e.g., the memory controller or the host device) of the semiconductor device 100.

Although not shown, the peripheral circuit 150 may further include various types of sub-circuits such as an input/output circuit, a voltage generating circuit for generating various voltages necessary to operate the semiconductor device 100, and an error correction circuit for correcting an error in the data DATA read from the memory cell array 130.

The control logic 110 may be connected to the row decoder 120, the voltage generating circuit, and the input/output circuit. The control logic 110 may control overall operations of the semiconductor device 100. The control logic 110 may generate various internal control signals to be used in the semiconductor device 100 in response to the control signal CTRL.

Figure 3:
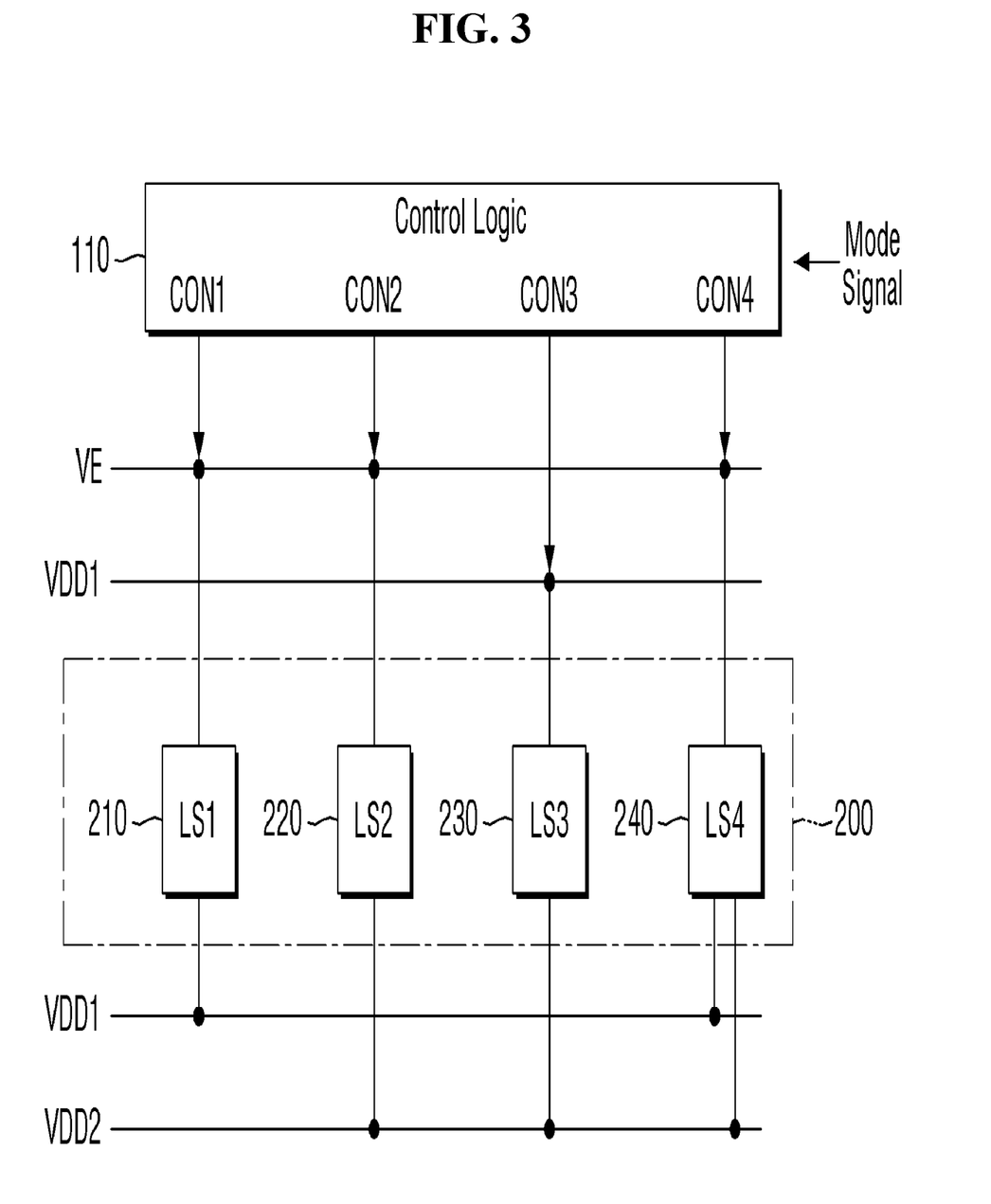
FIG. 3 is a block diagram illustrating a control logic and a level shifter according to some embodiments.

The control logic 110 may generate first to fourth control signals CON1 to CON4 illustrated in FIG. 3. The first to fourth control signals CON1 to CON4 generated by the control logic 110 may be provided to a level shifter 200. In example embodiments, the level shifter 200 may include the control logic 110.

For example, the control logic 110 may transmit, to the row decoder 120, control signals for adjusting a voltage applied to the word lines WL and the bit lines BL during a memory operation such as a read operation, a program operation or an erase operation.

The row decoder 120 may select at least one of the plurality of memory cell blocks BLK1 to BLKn in response to an address ADDR included in an internal control signal and select at least one word line WL, at least one string select line SSL, and at least one ground select line GSL of at least one selected from the memory cell blocks BLK1 to BLKn.

The row decoder 120 may transmit a voltage for performing a memory operation on the word line WL of one selected from the memory cell blocks BLK1 to BLKn. To this end, in some embodiments, the row decoder 120 may include the level shifter 200 but embodiments are not limited thereto.

The row decoder 120 may enable a level shifting operation of the level shifter 200 according to the first to fourth control signals CON1 to CON4. The row decoder 120 may provide a first internal voltage VDD1 of FIG. 3 and a second internal voltage VDD2 of FIG. 3, which are generated by the level shifter 200, to the memory cell array 130.

The level shifter 200 may level-shift an input voltage with a voltage corresponding to performing a memory operation, such as the read operation, the program operation or the erase operation, and output the level-shifted input voltage.

The page buffer 140 may be connected to the memory cell array 130 through the bit lines BL. The page buffer 140 may operate as a write driver or a sense amplifier.

Specifically, during the program operation, the page buffer 140 may operate as the write driver to apply a voltage according to the data DATA, to be stored in the memory cell array 130, to the bit lines BL. During the read operation, the page buffer 140 may operate as the sense amplifier to sense the data DATA stored in the memory cell array 130.

Figure 2:
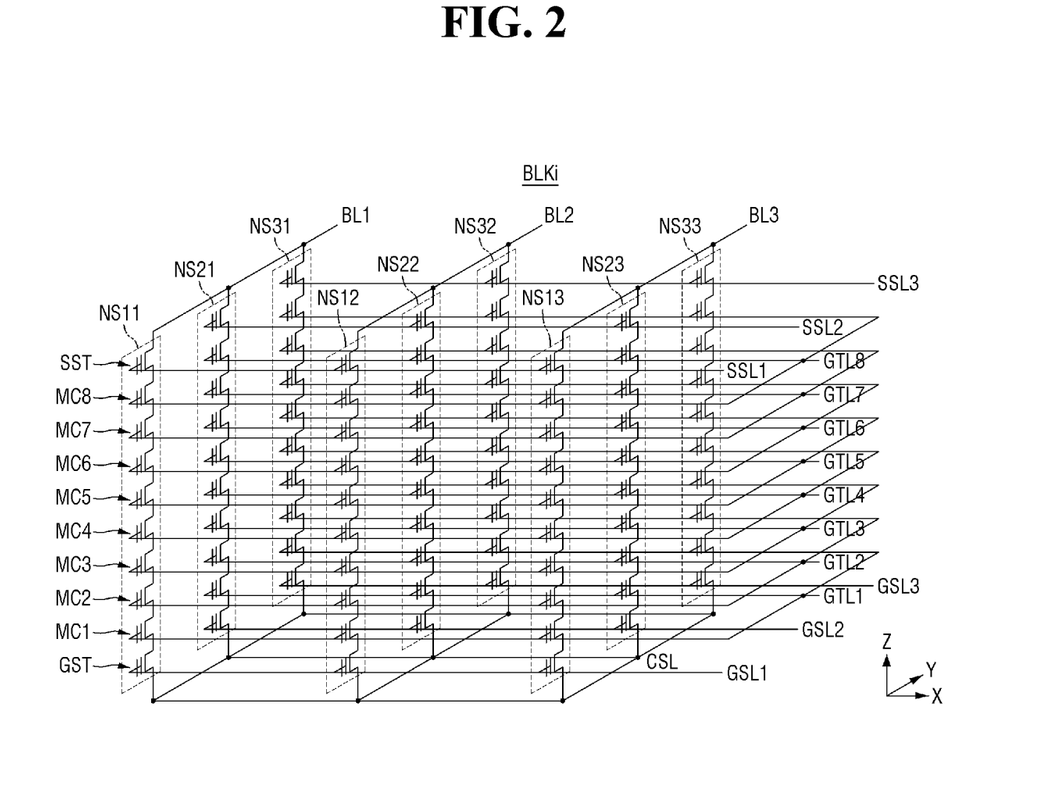
FIG. 2 is a diagram illustrating a three-dimensional (3D) V-NAND structure applicable to semiconductor devices according to some embodiments.

FIG. 2 is a diagram illustrating a three-dimensional (3D) V-NAND structure applicable to semiconductor devices according to some embodiments.

Referring to FIG. 2, when a storage module of a semiconductor device is implemented as a 3D V-NAND type flash memory, each of a plurality of memory blocks constituting the storage module may be represented by an equivalent circuit as illustrated in FIG. 2.

A memory block BLKi illustrated in FIG. 2 is a 3D memory block formed in a three-dimensional structure on a substrate. For example, a plurality of memory NAND strings included in the memory block BLKi may be formed in a direction perpendicular to the substrate.

Referring to FIG. 2, the memory block BLKi may include a plurality of memory NAND strings NS11, NS21 and NS31, NS12, NS22, and NS32, NS13, NS23, and NS33 connected between bit lines BL1, BL2, and BL3 and a common source line CSL.

Each of the plurality of memory NAND strings NS11 to NS33 may include a string select transistor SST, a plurality of memory cells MC1 to MC8, and a ground select transistor GST.

Although FIG. 2 illustrates that each of the plurality of memory NAND strings NS11 to NS33 includes eight memory cells MC1 to MC8, embodiments are not limited thereto.

The string selection transistor SST may be connected to a corresponding one of string select lines SSL1, SSL2, and SSL3. The plurality of memory cells MC1 to MC8 may each be connected to a corresponding one of gate lines GTL1 to GTL8. The gate lines GTL1 to GTL8 may correspond to word lines, and some of the gate lines GTL1 to GTL8 may correspond to dummy word lines.

The ground selection transistor GST may be connected to a corresponding one of ground select lines GSL1, GSL2, and GSL3. The string select transistor SST may be connected to a corresponding one of the bit lines BL1, BL2, and BL3, and the ground select transistor GST may be connected to the common source line CSL.

Word lines (e.g., word lines WL1) having the same height may be connected in common, and the ground select lines GSL1, GSL2, and GSL3 and the string select lines SSL1, SSL2, and SSL3 may be separated from each other. FIG. 2 illustrates that the memory block BLK is connected to the eight gate lines GTL1 to GTL8 and the three bit lines BL1, BL2, and BL3, but embodiments are not limited thereto.

FIG. 3 is a block diagram illustrating a control logic and a level shifter according to some embodiments.

Referring to FIG. 3, a semiconductor device 100 may include a control logic 110 and a level shifter 200.

The control logic 110 may generate first to third control signals CON1 to CON3. For example, the control logic 110 may generate the first to third control signals CON1 to CON3 based on a mode signal provided from an external device (e.g., the memory controller or the host device). Herein, an operation mode of the semiconductor device 100 corresponding to a mode signal may include a power-up mode, a normal mode (a read operation, a write operation, or an erase operation), a sleep mode, a deep sleep mode, a standby mode, or the like, but embodiments are not limited thereto. The first to third control signals CON1 to CON3 generated by the control logic 110 may be provided to the level shifter 200.

The level shifter 200 may include first to third level shifting circuits LS1 to LS3. The level shifter 200 may include level shifting circuits that each generates a voltage, which is different from a received voltage, using the received voltage on the basis of the first to third control signals CON1 to CON3 provided from the control logic 110.

For example, the first to third level shifting circuits LS1 to LS3 may change a voltage on the basis of the first to third control signals CON1 to CON3 provided from the control logic 110.

The first level shifting circuit 210 may receive the first control signal CON1 from the control logic 110. The first level shifting circuit 210 may be enabled by the first control signal CON1 to convert an external voltage VE into a first internal voltage VDD1. The first level shifting circuit 210 may generate the first internal voltage VDD1 using the received external voltage VE on the basis of the first control signal CON1.

The second level shifting circuit 220 may receive the second control signal CON2 from the control logic 110. The second level shifting circuit 220 may be enabled by the second control signal CON2 to convert the external voltage VE into a second internal voltage VDD2. The second internal voltage VDD2 may be lower than the first internal voltage VDD1. The second level shifting circuit 220 may generate the second internal voltage VDD2 using the received external voltage VE based the basis of the second control signal CON2.

The third level shifting circuit 230 may receive the third control signal CON3 from the control logic 110. The third level shifting circuit 230 may be enabled by the third control signal CON3 to convert the first internal voltage VDD1 into the second internal voltage VDD2. The third level shifting circuit 230 may generate the second internal voltage VDD2 using the received first internal voltage VDD1 on the basis of the third control signal CON3.

The control logic 110 may further generate the fourth control signal CON4 based on the mode signal. The level shifter 200 may further include a fourth level shifting circuit 240.

The fourth level shifting circuit 240 may receive the fourth control signal CON4 from the control logic 110. The fourth level shifting circuit 240 may be enabled by the fourth control signal CON4 to convert the external voltage VE into the first internal voltage VDD1 and the second internal voltage VDD2. The fourth level shifting circuit 240 may generate the first internal voltage VDD1 and the second internal voltage VDD2 using the received external voltage VE on the basis of the fourth control signal CON4.

For example, the fourth level shifting circuit 240 may simultaneously generate the first internal voltage VDD1 and second internal voltage VDD2, which are different voltages, using the external voltage VE.

In example embodiments, the control logic 110 may further generate fifth to mth control signals CON5 to CONm, and the level shifter 200 may further include fifth to mth level shifting circuits. Here, m is a natural number greater than 5.

An operation of a level shifter according to some embodiments will be described with reference to FIGS. 3 to 6 below.

Figure 4:
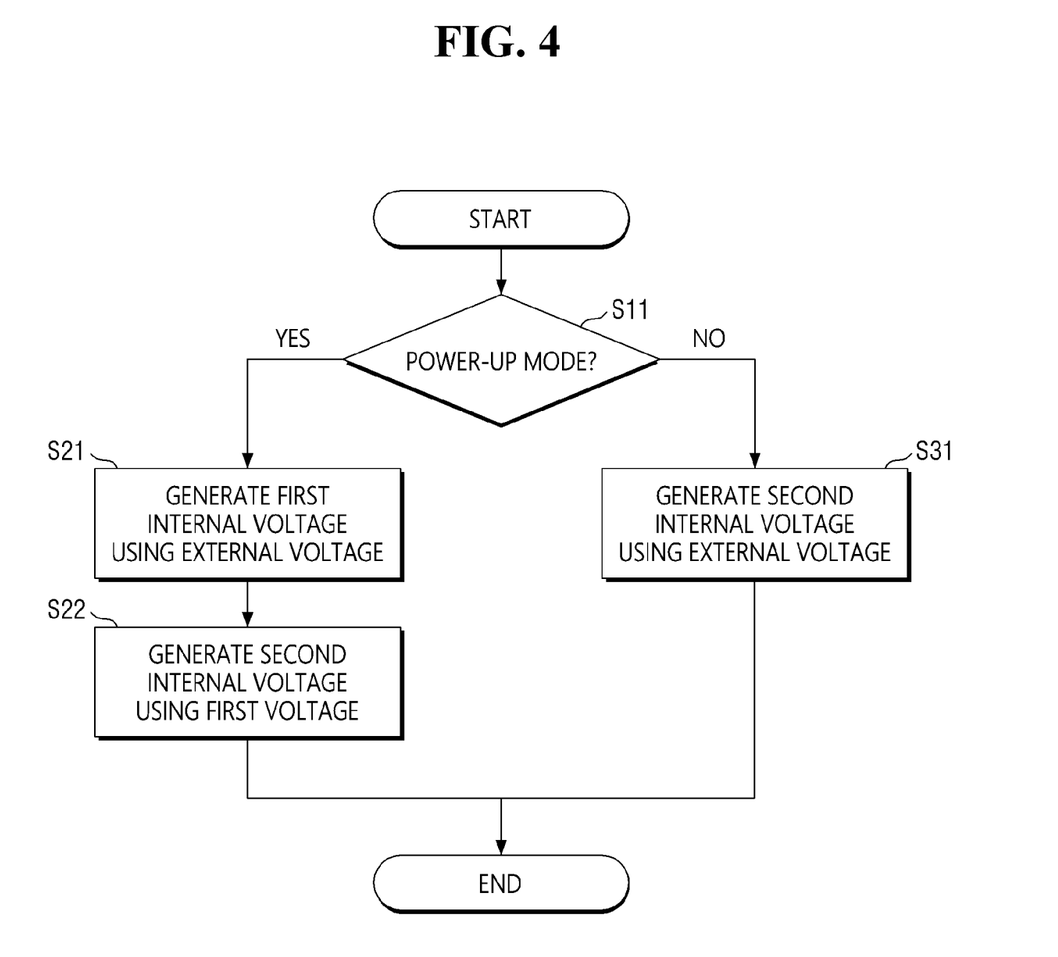
FIG. 4 is a flowchart of a level shifting method according to some embodiments.
Figure 5:
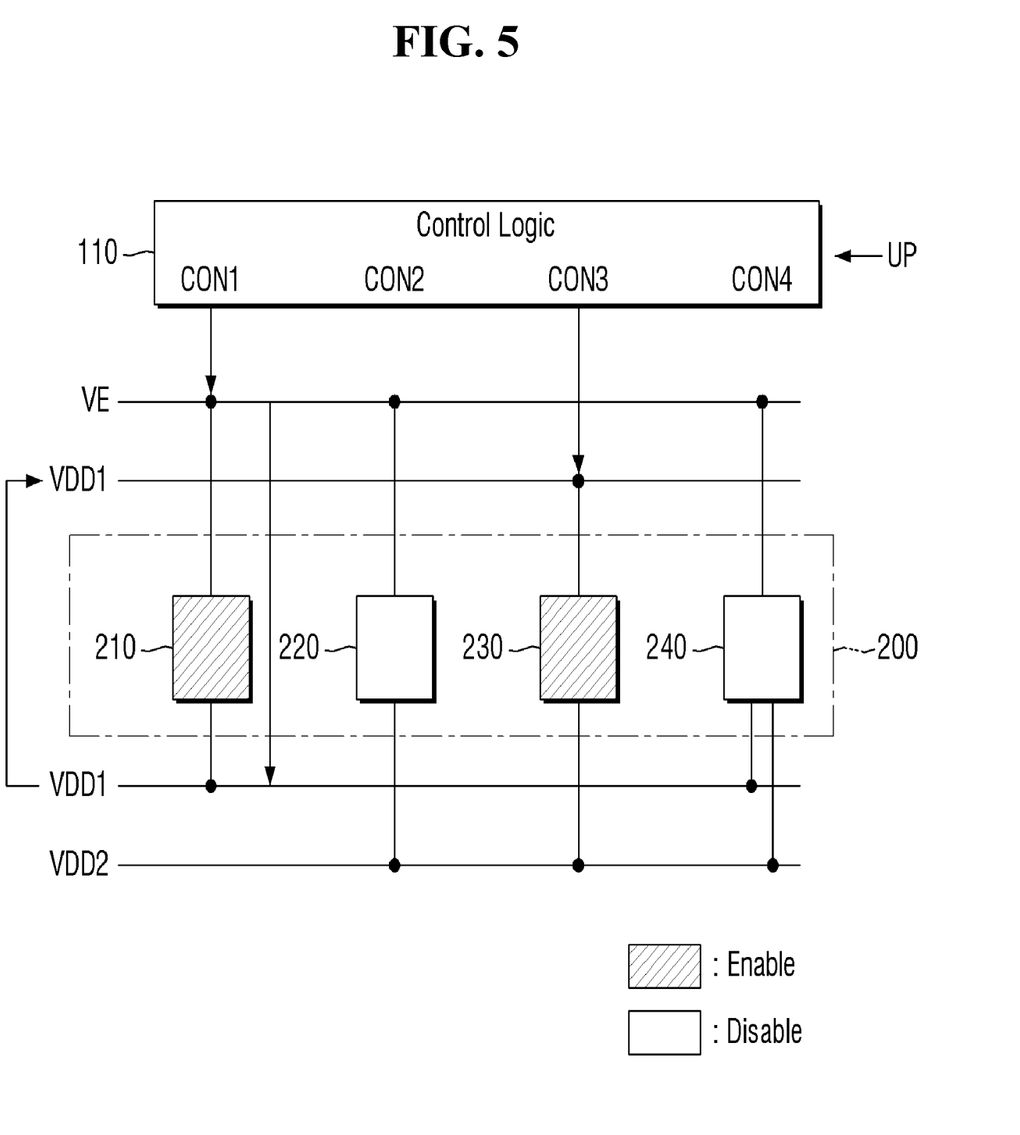
FIG. 5 is a diagram illustrating an operation of the level shifter of FIG. 3 in a first mode according to some embodiments.
Figure 6:
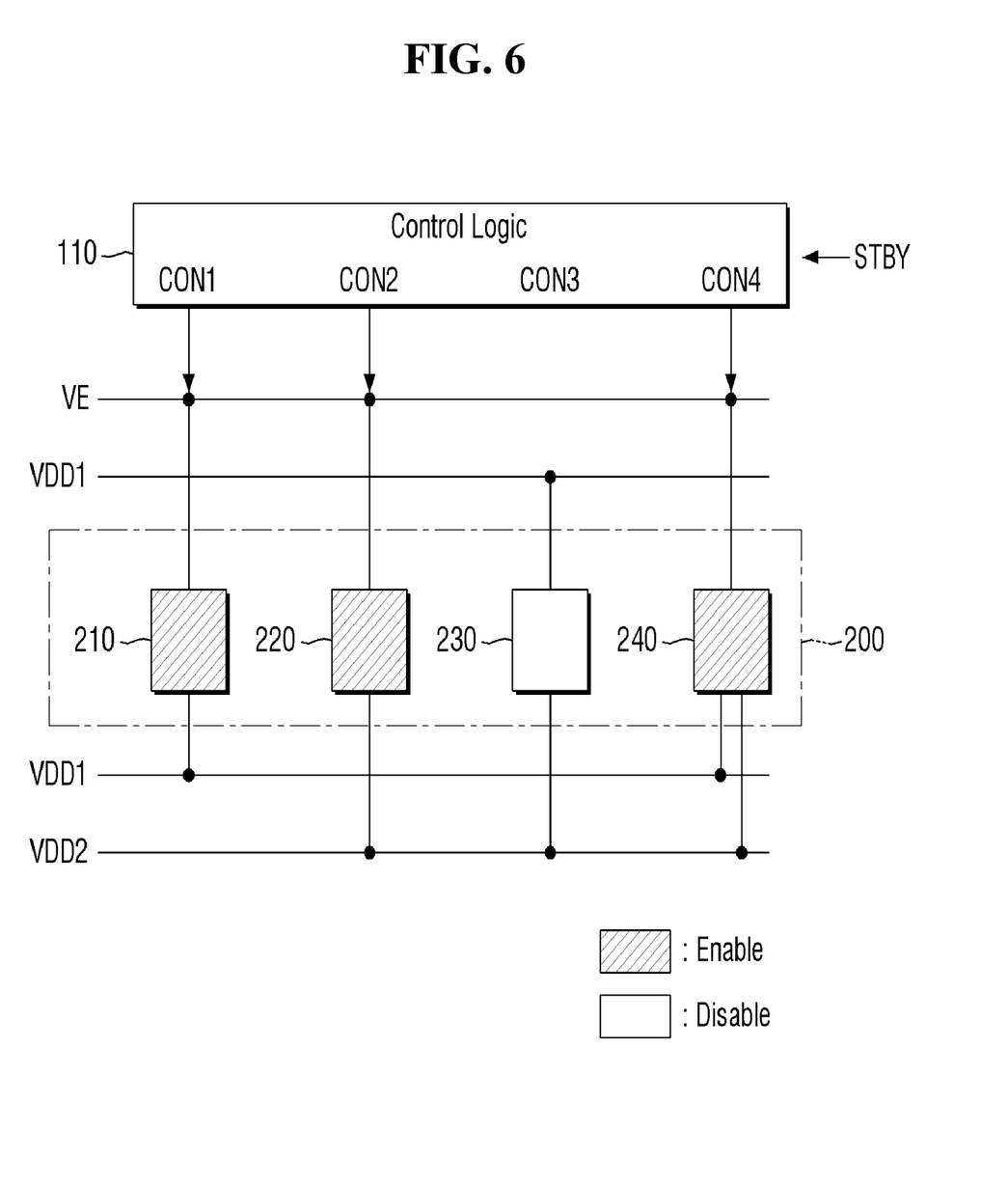
FIG. 6 is a diagram illustrating an operation of the level shifter of FIG. 3 in a second mode according to some embodiments.

FIG. 4 is a flowchart of a level shifting method according to some embodiments. FIG. 5 is a diagram illustrating an operation of the level shifter of FIG. 3 in a first mode according to some embodiments. FIG. 6 is a diagram illustrating an operation of the level shifter of FIG. 3 in a second mode according to some embodiments.

Referring to FIG. 4, whether a current mode is a first mode or a second mode is determined (S11).

For example, referring to FIG. 3, the control logic 110 may receive a mode signal provided from an external device and determine whether a current mode is the first mode or the second mode. For example, the control logic 110 may determine whether the semiconductor device 100 is in the first mode or the second mode.

Here, the first mode and the second mode may be different modes. In some embodiments, the first mode may include a power-up mode UP of FIG. 5, and the second mode may include a standby mode STBY of FIG. 6. In example embodiments, the second mode may include a specific mode of the semiconductor device other than the power-up mode UP, for example, a normal mode, a sleep mode or a deep sleep mode.

Referring back to FIG. 4, when the current mode of the semiconductor device is the power-up mode UP (YES in S11), a first internal voltage is generated using an external voltage (S21). Thereafter, a second internal voltage is generated using the generated first internal voltage (S22).

For example, referring to FIG. 5, the control logic 110 may receive a power-up mode UP signal and enable control signals corresponding to the power-up mode UP among the control signals CON1 to CON4.

For example, in the power-up mode UP, the control logic 110 may enable the first control signal CON1 and the third control signal CON3 and disable the second control signal CON2 and the fourth control signal CON4.

Whether level shifting circuits 210 to 240 are to be enabled may be determined according to the control signals CON1 to CON4.

Specifically, the first level shifting circuit 210 may be enabled in response to the enabled first control signal CON1, the second level shifting circuit 220 may be disabled in response to the disabled second control signal CON2, the third level shifting circuit 230 may be enabled in response to the enabled third control signal CON3, and the fourth level shifting circuit 240 may be disabled in response to the disabled fourth control signal CON4.

The first level shifting circuit 210 may be enabled by the first control signal CON1 to convert the external voltage VE into a first internal voltage VDD1. The third level shifting circuit 230 may be enabled by the third control signal CON3 to convert the first internal voltage VDD1 generated by the first level shifting circuit 210 into the second internal voltage VDD2. Here, the first internal voltage VDD1 is higher than the second internal voltage VDD2. In some examples, the first internal voltage VDD1 may be provided to the memory cell array 130 of the semiconductor device 100 and the second internal voltage VDD2 may be provided to the input/output circuit of the semiconductor device 100.

Because the second level shifting circuit 220 and the fourth level shifting circuit 240 are disabled, the second level shifting circuit 220 and the fourth level shifting circuit 240 do not perform a voltage conversion operation.

For example, in the power-up mode UP, the second internal voltage VDD2 may not be generated directly using the external voltage VE but may be generated through generating of the first internal voltage VDD1. According to this operation, a leakage current in a level shifting circuit may be reduced or prevented during a power-up process. This will be described in detail below.

Referring back to FIG. 4, when the current mode of the semiconductor device 100 is the standby mode STBY and not the power-up mode UP (NO in S11), the second internal voltage is generated using the external voltage (S31). In other examples, when the current mode of the semiconductor device 100 is the normal mode and not the power-up mode UP (NO in S11), the second internal voltage is generated using the external voltage (S31).

For example, referring to FIG. 6, the control logic 110 may receive a standby mode STBY signal and enable control signals corresponding to the standby mode STBY among the control signals CON1 to CON4.

For example, in the standby mode STBY, the control logic 110 may enable the first control signal CON1, the second control signal CON2, and the fourth control signal CON4 and disable the third control signal CON3.

Whether level shifting circuits 210 to 240 are to be enabled may be determined according to the control signals CON1 to CON4.

Specifically, in the standby mode STBY, the first level shifting circuit 210 may be enabled in response to the enabled first control signal CON1, the second level shifting circuit 220 may be enabled in response to the enabled second control signal CON2, the third level shifting circuit 230 may be disabled in response to the disabled third control signal CON3, and the fourth level shifting circuit 240 may be enabled in response to the enabled fourth control signal CON4.

The first level shifting circuit 210 may be enabled by the first control signal CON1 to convert the external voltage VE into the first internal voltage VDD1. The second level shifting circuit 220 may be enabled by the second control signal CON2 to convert the external voltage VE into the second internal voltage VDD2. The fourth level shifting circuit 240 may be enabled by the fourth control signal CON4 to convert the external voltage VE into the first internal voltage VDD1 and the second internal voltage VDD2. Here, the first internal voltage VDD1 is higher than the second internal voltage VDD2.

Because the third level shifting circuit 230 is disabled, the third level shifting circuit 230 does not perform the voltage conversion operation.

For example, in the standby mode STBY, the second internal voltage VDD2 may not be generated using the first internal voltage VDD1 but may be generated directly using the external voltage VE, unlike in the power-up mode UP described above with reference to FIG. 5.

In example embodiments, the control logic 110 may receive a normal mode signal (not shown). In this case, the control logic 110 may enable the number of control signals greater than the number of control signals in the standby mode STBY, and the number of enabled level shifting circuits may be greater than the number of enabled level shifting circuits in the standby mode STBY. For example, in the normal mode, the first, second, and fourth level shifting circuits 210, 220, and 240, and one or more additional level shifting circuits may be enabled in response to the enabled first, second, and fourth control signals CON1, CON2, and CON4, and one or more additional enabled control signals, and the third level shifting circuit 230 may be disabled in response to the disabled third control signal CON3.

Figure 7:
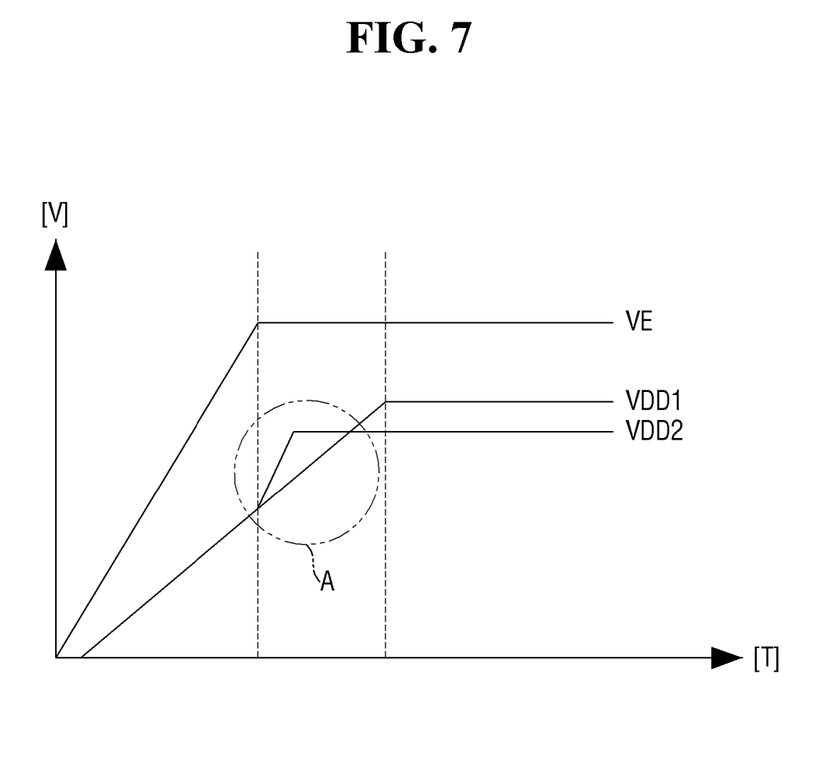
FIG. 7 is a graph showing an external voltage, a first internal voltage, and a second internal voltage in a power-up mode of a level shifter different from that of the present embodiment.
Figure 8:
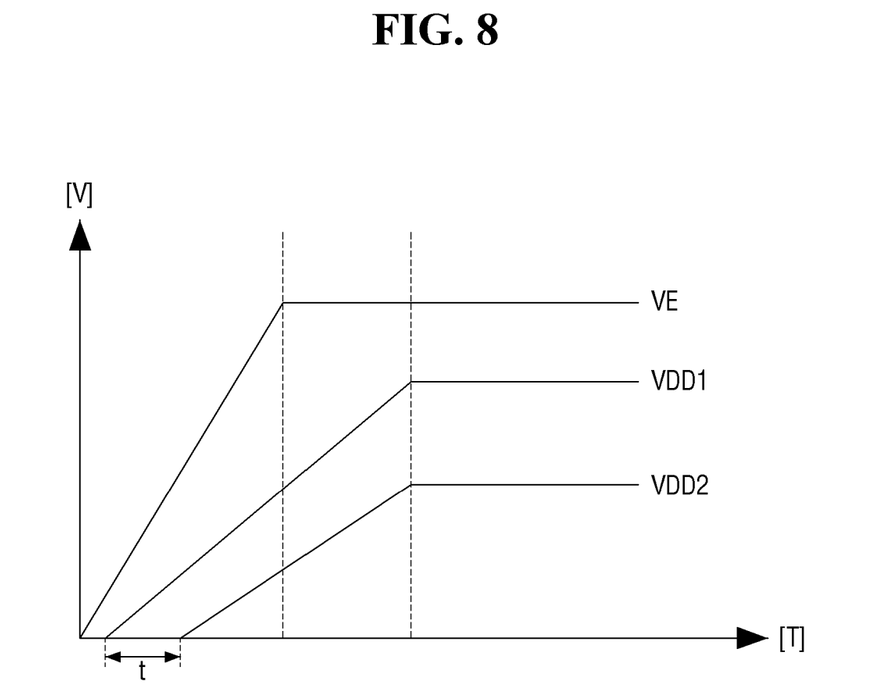
FIG. 8 is a graph showing an external voltage, a first internal voltage, and a second internal voltage in a power-up mode of the level shifter according to some embodiments.

FIG. 7 is a graph showing an external voltage, a first internal voltage, and a second internal voltage in a power-up mode of a level shifter different from that of the present embodiment. FIG. 8 is a graph showing an external voltage, a first internal voltage, and a second internal voltage in a power-up mode of the level shifter according to the present embodiments.

Referring to FIG. 7, in the power-up mode UP, a first internal voltage VDD1 and a second internal voltage VDD2 may be generated using an external voltage VE. When the first internal voltage VDD1 and the second internal voltage VDD2 are simultaneously generated using the external voltage VE, a reverse voltage between the first internal voltage VDD1 and the second internal voltage VDD2 may occur as indicated by a circle A, thereby causing a leakage current. The leakage current may flow from the second internal voltage VDD2 to a ground through transistors turned on by the first internal voltage VDD1 relatively lower than the second internal voltage VDD2 during a power-up mode UP of the semiconductor device 100.

Referring to FIG. 8, in the power-up mode UP, after a first internal voltage VDD1 is generated using an external voltage VE, a second internal voltage VDD2 may be generated using the generated first internal voltage VDD1. For example, because there is a time difference t between when the first internal voltage VDD1 is generated and when the second internal voltage VDD2 is generated, a reverse voltage between the first internal voltage VDD1 and the second internal voltage VDD2 may be prevented, unlike in FIG. 7. Because the reverse voltage is not generated, a leakage current may be prevented from occurring.

Figure 9:
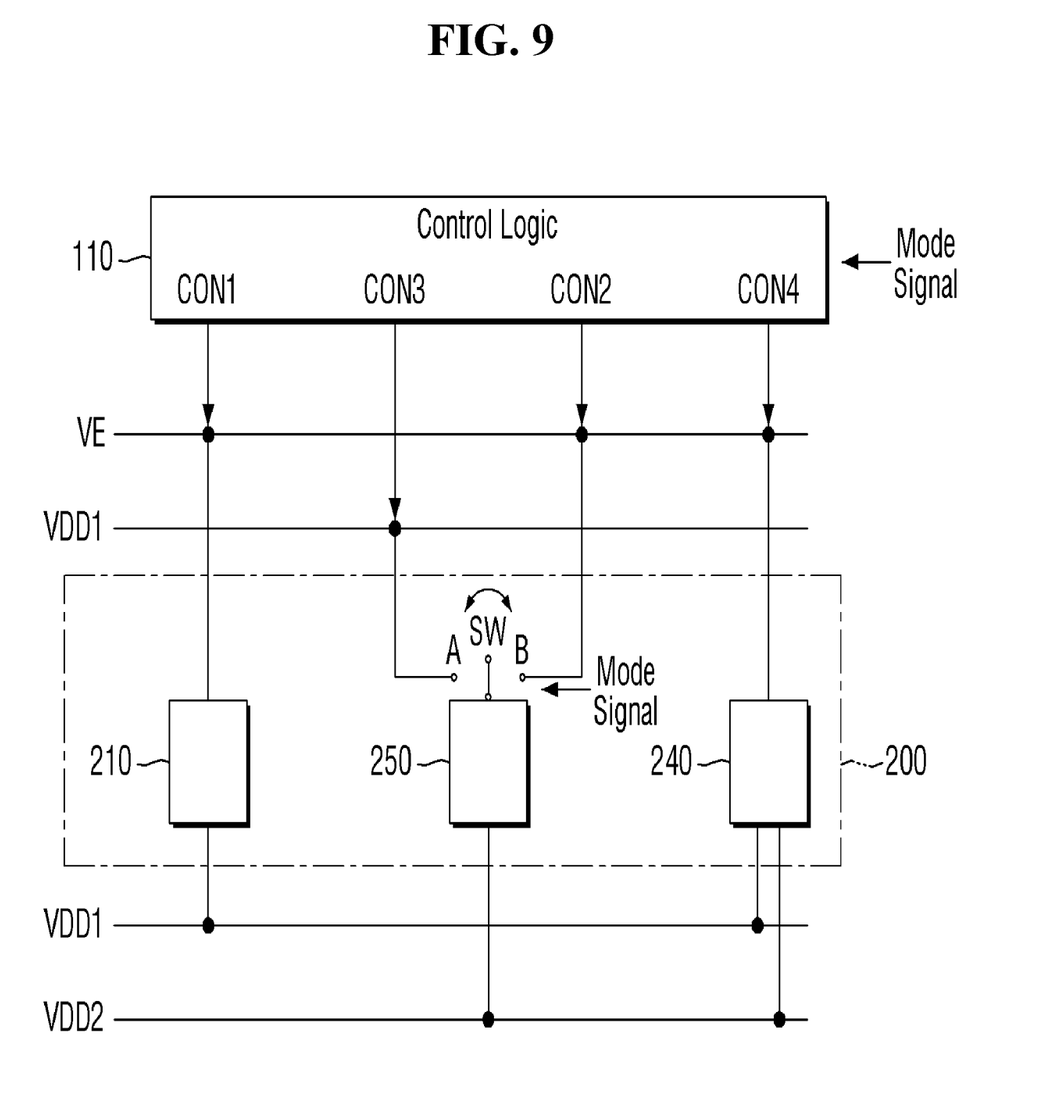
FIG. 9 is a block diagram illustrating a control logic and a level shifter according to some embodiments.

FIG. 9 is a block diagram illustrating a control logic and a level shifter according to some embodiments.

FIG. 9 will now be described focusing on the differences from FIG. 3.

Referring to FIG. 9, the level shifter 200 may include a first level shifting circuit 210, and a second level shifting circuit 250.

The second level shifting circuit 250 may be controlled by a mode signal indicating any one of a first mode and a second mode. The second level shifting circuit 250 may include a switch SW that provides any one of an external voltage VE and a first internal voltage VDD1 according to a mode signal.

The switch SW of the second level shifting circuit 250 may be connected to a node A to which the first internal voltage VDD1 is provided in the first mode and connected to a node B to which the external voltage VE is provided in the second mode.

The level shifter 200 may further include a fourth level shifting circuit 240. The third level shifting circuit 240 may convert the external voltage VE into the first internal voltage VDD1 and the second internal voltage VDD2.

For example, the fourth level shifting circuit 240 may simultaneously generate the first internal voltage VDD1 and second internal voltage VDD2, which are different voltages, using the external voltage VE.

Operations of a level shifter according to some embodiments will be described with reference to FIGS. 10 and 11 below.

Figure 10:
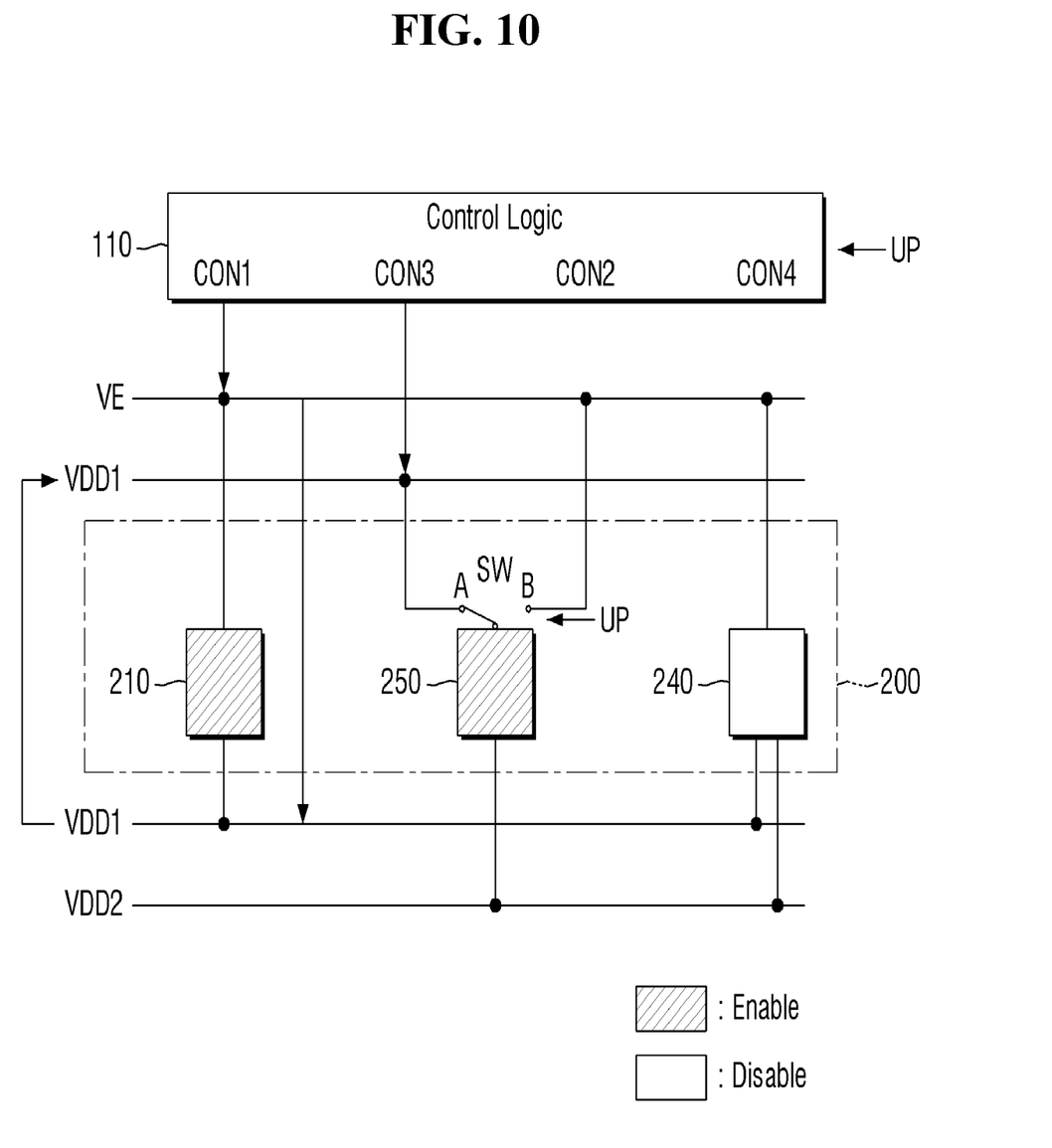
FIG. 10 is a block diagram illustrating a level shifter in the first mode of FIG. 9 according to some embodiments.

FIG. 10 is a block diagram illustrating a level shifter in the first mode of FIG. 9 according to some embodiments.

Operations in the power-up mode UP described above with reference to FIG. 4 will be described with reference to FIG. 10 below. FIG. 10 will be described focusing on the differences from FIGS. 4 and 5.

Referring to FIG. 10, a control logic 110 may receive a power-up mode UP signal and enable control signals corresponding to the power-up mode UP among the control signals CON1 to CON4.

For example, in the power-up mode UP, the control logic 110 may enable the first control signal CON1 and the third control signal CON3 and disable the second control signal CON2 and the fourth control signal CON4.

Whether level shifting circuits 210, 250 and 240 are to be enabled may be determined according to the control signals CON1 to CON4.

Specifically, the first level shifting circuit 210 may be enabled in response to the enabled first control signal CON1. For example, the first level shifting circuit 210 may be enabled by the first control signal CON1 to convert an external voltage VE into a first internal voltage VDD1.

After the external voltage VE is converted into the first internal voltage VDD1, a switch SW of the second level shifting circuit 250 may be connected to a node A to which the first internal voltage VDD1 is provided by a power-up mode UP signal.

The second level shifting circuit 250 may be enabled by the third control signal CON3 to convert the first internal voltage VDD1 into the second internal voltage VDD2. Here, the first internal voltage VDD1 may be higher than the second internal voltage VDD2.

The fourth level shifting circuit 240 is disabled and thus does not perform a voltage conversion operation.

For example, in the power-up mode UP, the second internal voltage VDD2 may not be generated directly using the external voltage VE but may be generated through generating of the first internal voltage VDD1. According to this operation, a leakage current in a level shifting circuit may be reduced during a power-up process.

Figure 11:
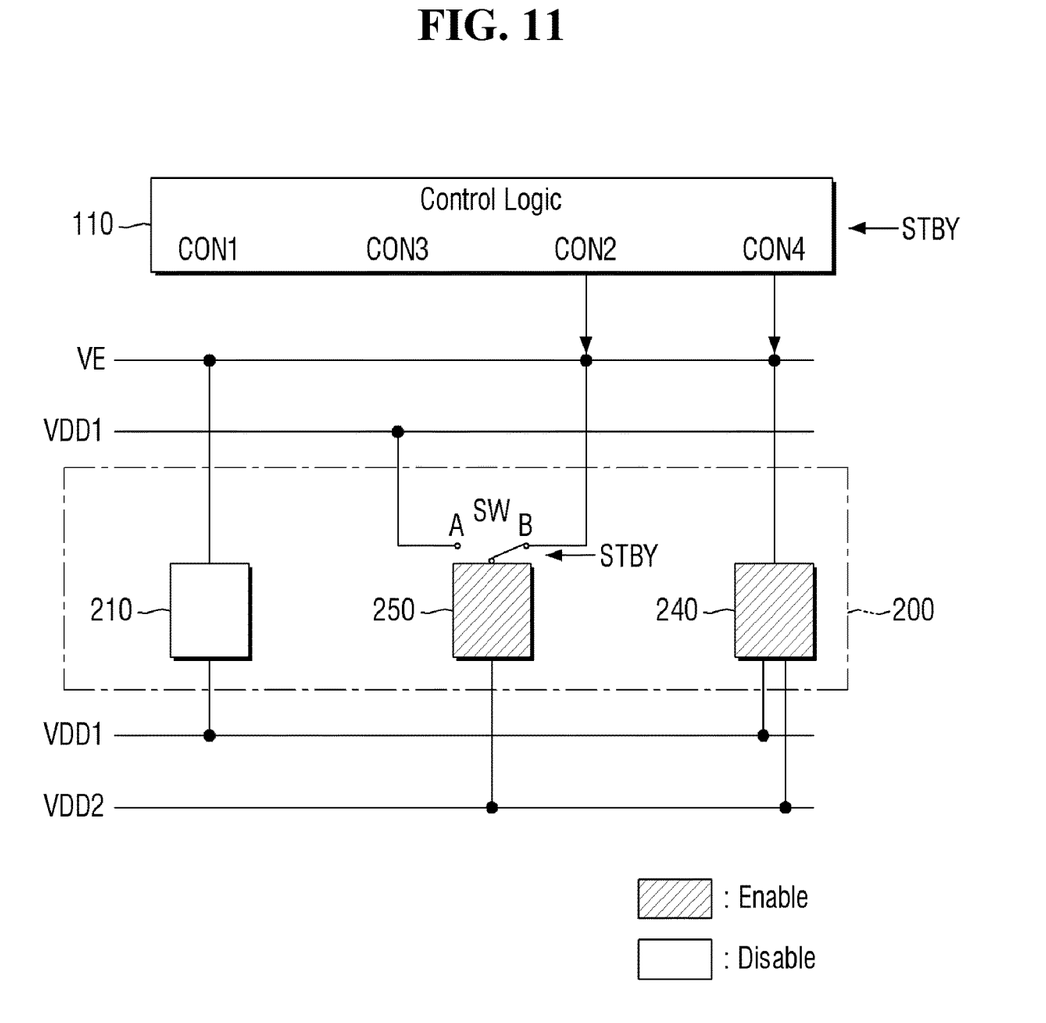
FIG. 11 is a block diagram illustrating a level shifter in the second mode of FIG. 9 according to some embodiments.

FIG. 11 is a block diagram illustrating a level shifter in the second mode of FIG. 9 according to some embodiments.

An operation of the standby mode STBY described above with reference to FIG. 4 will be described with reference to FIG. 11 below. FIG. 11 will be described focusing on the differences from FIGS. 4 and 6.

Referring to FIG. 11, the control logic 110 may receive a standby mode STBY signal and enable control signals corresponding to the standby mode STBY among the control signals CON1 to CON4.

For example, in the standby mode STBY, the control logic 110 may enable the second control signal CON2 and the fourth control signal CON4 and disable the first control signal CON1 and the third control signal CON5.

Whether level shifting circuits 210, 250 and 240 are to be enabled may be determined according to the control signals CON1 to CON4.

Specifically, the first level shifting circuit 210 may be disabled in response to the disabled first control signal CON1, the second level shifting circuit 250 may be enabled in response to the enabled second control signal CON2, and the fourth level shifting circuit 240 may be enabled in response to the enabled fourth control signal CON4. In other examples, in the standby mode STBY, the control logic 110 may enable the first control signal CON1 and the first level shifting circuit 210 may be enabled in response to the enabled first control signal CON1.

A switch SW of the second level shifting circuit 250 may be connected to a node B to which an external voltage VE is provided by the standby mode STBY signal.

The second level shifting circuit 250 may be enabled by the second control signal CON2 to convert the external voltage VE into a second internal voltage VDD2.

The fourth level shifting circuit 240 may be enabled by the fourth control signal CON4 to convert the external voltage VE into the first internal voltage VDD1 and the second internal voltage VDD2. Here, the first internal voltage VDD1 may be higher than the second internal voltage VDD2.

The first level shifting circuit 210 is disabled and thus does not perform a voltage conversion operation.

For example, in the standby mode STBY, the second internal voltage VDD2 may not be generated from the first internal voltage VDD1 but may be generated directly using the external voltage VE, unlike in the power-up mode UP described above with reference to FIG. 10.

In example embodiments, the control logic 110 may receive a normal mode signal (not shown). In this case, the control logic 110 may enable the number of control signals greater than the number of control signals in the standby mode STBY, and the number of enabled level shifting circuits may be greater than the number of enabled level shifting circuits in the standby mode STBY. For example, in the normal mode, the control logic 110 may enable the second and fourth control signals CON2 and CON4, and one or more additional control signals, and disable the first and third control signals CON1 and CON3, and the second and fourth level shifting circuits 210 and 240, and one or more additional level shifting circuits may be enabled in response to the enabled second and fourth control signals CON2 and CON4, and one or more additional enabled control signals, and the first and third level shifting circuits 210 and 230 may be disabled in response to the disabled first and third control signals CON1 and CON3.

Figure 12:
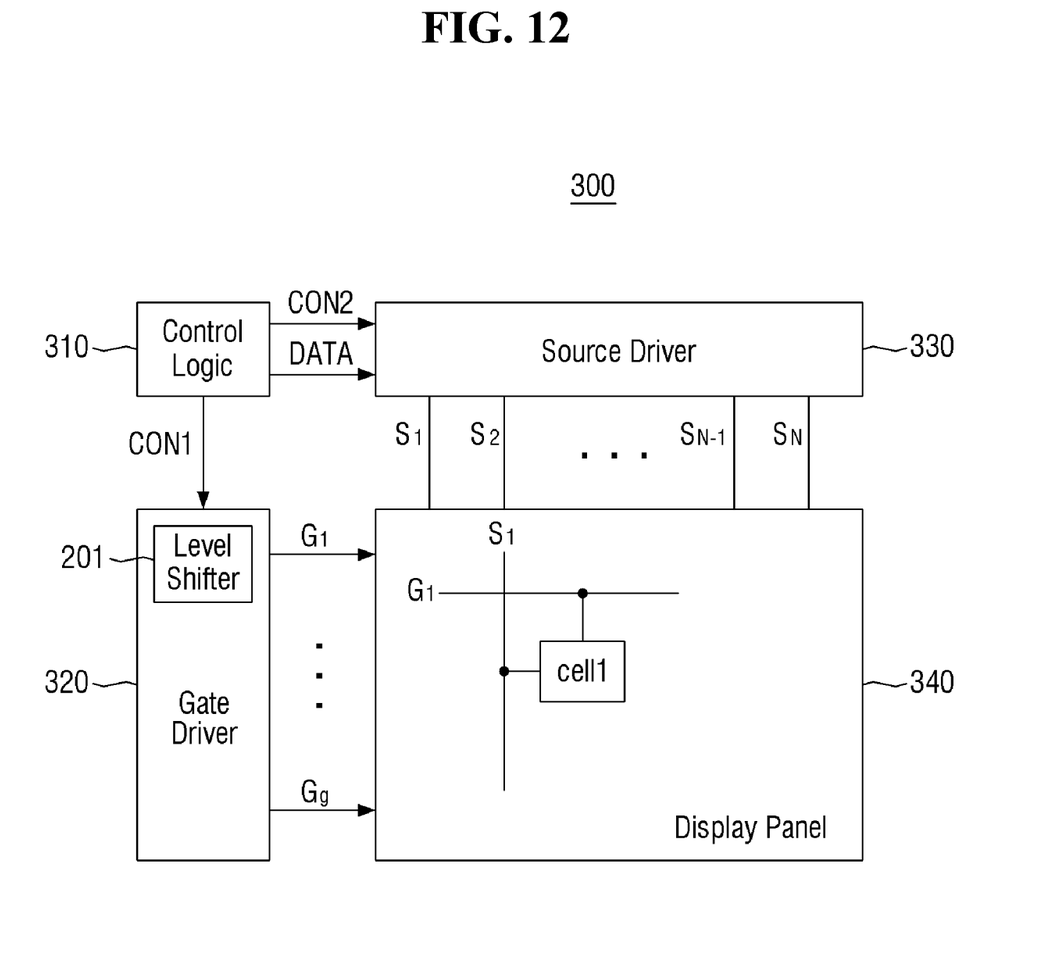
FIG. 12 is a block diagram of a display device including a level shifter according to some embodiments.

FIG. 12 is a block diagram of a display device including a level shifter according to some embodiments.

Referring to FIG. 12, a display device 300 may include a control logic 310, a gate driver 320, a source driver 330, and a display panel 340.

The gate driver 320 may sequentially drive a plurality of gate lines (or scan liens) included in the display panel 340 in response to a control signal CON1 output from the control logic 310 so that data output from the source driver 330 may be supplied to a plurality of pixels. In this case, the gate driver 320 may include a level shifter 201 according to some embodiments of the present disclosure and may level-shift a driving voltage for driving a gate line in response to the control signal CON1.

The source driver 330 may drive a plurality of data lines (or source lines) included in the display panel 340 in response to a control signal CON2 output from the control logic 310 and transmit the data to the display panel 340.

The display panel 340 includes a plurality of data lines S1 to $S_N$, a plurality of gate lines G1 to Gg, and a plurality of pixels Cell connected between the plurality of data lines S1 to $S_N$ and the plurality of gate lines G1 to Gg.

While example embodiments of the present disclosure have been particularly shown and described, it will be understood by one of ordinary skill in the art that variations in form and detail may be made therein without departing from the spirit and scope of the attached claims.

What is claimed is:

1. A semiconductor device comprising:
   a memory cell array including a plurality of memory blocks;
   a control logic;
   a level shifter configured to generate a first internal voltage and a second internal voltage lower than the first internal voltage using a received external voltage on the basis of a control signal from the control logic; and
   a row decoder configured to provide the first and second internal voltages generated by the level shifter to the memory cell array,
   wherein the level shifter is configured to:
   generate the first internal voltage using the external voltage,
   generate the second internal voltage using the generated first internal voltage in a power-up mode of the semiconductor device, and
   generate the second internal voltage using the external voltage in a standby mode of the semiconductor device.

2. The semiconductor device of claim 1, wherein the control logic is configured to generate a first control signal, a second control signal, a third control signal, and a fourth control signal, and
   wherein the level shifter comprises:
   a first level shifting circuit configured to be enabled by the first control signal to convert the external voltage into the first internal voltage;
   a second level shifting circuit configured to be enabled by the second control signal to convert the external voltage into the second internal voltage;
   a third level shifting circuit configured to be enabled by the third control signal to convert the first internal voltage into the second internal voltage; and
   a fourth level shifting circuit configured to be enabled by the fourth control signal to convert the external voltage into the first and second internal voltages.

3. The semiconductor device of claim 2, wherein, in the power-up mode, the first and third level shifting circuits are configured to be enabled by the first and third control signals and the second and fourth level shifting circuits are configured to be disabled by the second and fourth control signals, and
   wherein, in the standby mode, the first level shifting circuit, the second level shifting circuit, and the fourth level shifting circuit are configured to be enabled by the first, second and fourth control signals, and the third level shifting circuit is configured to be disabled by the third control signal.

4. The semiconductor device of claim 1, wherein the level shifter comprises:
   a first level shifting circuit configured to generate the second internal voltage; and
   a switch configured to be controlled by a mode signal indicating the power-up mode or the standby mode and to provide the external voltage or the first internal voltage to the first level shifting circuit in response to the mode signal.

5. A level shifter of a semiconductor device, comprising:
   a control logic; and
   a level shifting circuit configured to generate a first internal voltage using a received external voltage on the basis of a control signal from the control logic,
   wherein the level shifting circuit is configured to:
   generate a second internal voltage, which is higher than the first internal voltage, using the external voltage,
   generate the first internal voltage using the second internal voltage in a first mode of the semiconductor device, and
   generate the first internal voltage using the external voltage in a second mode of the semiconductor device different from the first mode.

6. The level shifter of claim 5, wherein the control logic is configured to generate a first control signal, a second control signal, and a third control signal, and
   wherein the level shifting circuit comprises:
   a first level shifting circuit configured to be enabled by the first control signal to convert the external voltage into the second internal voltage;
   a second level shifting circuit configured to be enabled by the second control signal to convert the external voltage into the first internal voltage; and
   a third level shifting circuit configured to be enabled by the third control signal to convert the second internal voltage into the first internal voltage.

7. The level shifter of claim 6, wherein, in the first mode, the first and third level shifting circuits are configured to be enabled by the first and third control signals and the second level shifting circuit is configured to be disabled by the second control signal.

8. The level shifter of claim 7, wherein, in the second mode, the first and second level shifting circuits are configured to be enabled by the first and second control signals and the third level shifting circuit is configured to be disabled by the third control signal.

9. The level shifter of claim 6, wherein the control logic is configured to further generate a fourth control signal, and
   wherein the level shifting circuit further comprises a fourth level shifting circuit configured to be enabled by the fourth control signal to convert the external voltage into the first internal voltage and the second internal voltage.

10. The level shifter of claim 9, wherein, in the first mode, the first and third level shifting circuits are configured to be enabled by the first and third control signals and the second and fourth level shifting circuits are configured to be disabled by the second and fourth control signals.

11. The level shifter of claim 10, wherein, in the second mode, the first level shifting circuit, the second level shifting circuit, and the fourth level shifting circuit are configured to be enabled by the fourth control signal, and the third level shifting circuit is configured to be disabled by the third control signal.

12. The level shifter of claim 5, wherein the first mode includes a power-up mode and the second mode includes a standby mode or a normal mode.

13. The level shifter of claim 5, further comprising a switch configured to be controlled by a mode signal indicating the first or the second mode and to provide the external voltage or the second internal voltage to the level shifting circuit based on the mode signal.

14. The level shifter of claim 13, wherein the level shifting circuit comprises:
   a first level shifting circuit configured to receive the external voltage or the second internal voltage from the switch, and convert the external voltage or the second internal voltage into the first internal voltage; and a second level shifting circuit configured to convert the external voltage into the second internal voltage.

15. The level shifter of claim 14, wherein the level shifting circuit further comprises a third level shifting circuit configured to convert the external voltage into the first internal voltage and the second internal voltage.

16. A level shifting method for a semiconductor device comprising:

receiving an external voltage;

determining whether the semiconductor device is in a first mode or a second mode different from the first mode;

in the first mode, generating a first internal voltage using the received external voltage, and generating a second internal voltage lower than the first internal voltage using the first internal voltage; and in the second mode, generating the second internal voltage using the received external voltage.

17. The level shifting method of claim 16, wherein, in the second mode, further comprising simultaneously generating the first internal voltage using the external voltage.

18. The level shifting method of claim 16, further comprising providing the generated first and second internal voltages to a plurality of memory cells in a memory cell array of the semiconductor device.

19. The level shifting method of claim 16, further comprising generating the second internal voltage using a source voltage by providing a level shifting circuit, wherein the generating of the first internal voltage comprises providing the first internal voltage as the source voltage to the level shifting circuit, and wherein, in the second mode, the generating of the second internal voltage comprises providing the external voltage as the source voltage to the level shifting circuit.

20. The level shifting method of claim 16, wherein the first mode includes a power-up mode and the second mode includes a standby mode or a normal mode.

* * * * *